US006954395B2

(12) United States Patent
Rolandi

(10) Patent No.: US 6,954,395 B2
(45) Date of Patent: Oct. 11, 2005

(54) STRING PROGRAMMABLE NONVOLATILE MEMORY WITH NOR ARCHITECTURE

(75) Inventor: Paolo Rolandi, Voghera (IT)

(73) Assignee: STMicroelectronics S.r.l., Agrate Brianza (IT)

(*) Notice: Subject to any disclaimer, the term of this patent is extended or adjusted under 35 U.S.C. 154(b) by 60 days.

(21) Appl. No.: 10/742,181

(22) Filed: Dec. 19, 2003

(65) Prior Publication Data

US 2004/0130948 A1 Jul. 8, 2004

Related U.S. Application Data

(62) Division of application No. 10/179,553, filed on Jun. 24, 2002, now Pat. No. 6,683,808, which is a division of application No. 09/817,363, filed on Mar. 20, 2001, now Pat. No. 6,414,875.

(30) Foreign Application Priority Data

Mar. 21, 2000 (EP) ............................................ 00830209

(51) Int. Cl.[7] .............................................. G11C 7/00
(52) U.S. Cl. ............. 365/219; 365/185.12; 365/185.17; 365/189.12; 341/100
(58) Field of Search ....................... 365/185.12, 185.17, 365/219, 220, 221, 235; 341/100, 101

(56) References Cited

U.S. PATENT DOCUMENTS 5,508,967 A * 4/1996 Karino ........................ 365/219
5,682,389 A 10/1997 Nizaka ........................ 714/718
5,777,923 A 7/1998 Lee et al. ............... 365/185.11
5,798,547 A 8/1998 Urai ............................ 257/316
5,812,454 A 9/1998 Choi ....................... 365/185.17
5,910,928 A 6/1999 Joffe .......................... 365/230.5
5,926,120 A * 7/1999 Swenson et al. ............. 341/100
5,995,988 A 11/1999 Freidin et al. ............... 708/232
5,999,478 A 12/1999 Proebsting ............. 365/230.05
6,304,489 B1 10/2001 Iwahashi ............... 365/185.17

* cited by examiner

Primary Examiner—Van Thu Nguyen
(74) Attorney, Agent, or Firm—Lisa K. Jorgenson; Harold K. Bennett, II; Seed IP Law Group PLLC

(57) ABSTRACT

A nonvolatile memory with a memory array arranged in rows and columns of memory cells in NOR configuration, the memory cells arranged on a same column being connected to one of a plurality of bit lines and a column decoder. The column decoder comprises a plurality of selection stages, each of which is connected to respective bit lines and receives first bit line addressing signals. The selection stages comprise word programming selectors controlled by the first bit line addressing signals and supplying a programming voltage to only one of the bit lines of each selection stage. Each selection stage moreover comprises a string programming selection circuit controlled by second bit line addressing signals thereby simultaneously supplying the programming voltage to a plurality of the bit lines of each selection stage.

8 Claims, 7 Drawing Sheets

STRING PROGRAMMABLE NONVOLATILE MEMORY WITH NOR ARCHITECTURE

CROSS-REFERENCE TO RELATED APPLICATION

This application is a divisional of U.S. patent application Ser. No. 09/817,363 (U.S. Pat. No. 6,414,875), filed Mar. 20, 2001, now issued which is U.S. patent application Ser. No. 10/179,553, filed Jun. 24, 2002, now U.S. Pat. No. 6,683,808, which applications are incorporated herein by reference in their entireties.

TECHNICAL FIELD

The present invention refers to a string programmable nonvolatile memory with NOR architecture.

BACKGROUND OF THE INVENTION

As known, many of the characteristics of a nonvolatile memory, such as reading and programming speeds, are determined by the architecture of the memory, as well as by the employed manufacturing process.

At present, extensively used nonvolatile memories have a so-called NAND and NOR architectures.

In NAND memories, groups of memory cells, arranged in series and belonging to distinct memory words, are connected to respective bit lines so as to form strings of cells. One memory word is formed by a plurality of adjacent cells connected to different bit lines, while a word string is formed by a plurality of cell strings. In particular, a word string comprises a number of memory words equal to the number of cells contained in a cell string.

NAND memories are advantageous mainly because they have a low bulk and allow the so-called string programming. In fact, all the cells in a cell string can be programmed by biasing the gate terminal of each cell at a programming gate voltage, and the relevant bit line at a programming drain voltage. In this way, by the Fowler-Nordheim effect, controlled charges reach a floating gate region of each selected cell. Consequently, in a single programming step, byte strings (normally 8 or 16 bytes at a time) may be written. Programming of a NAND memory is therefore very fast.

On the other hand, NAND memories have very long access times and consequently they do not meet the requisites of reading speed currently demanded in most applications. In addition, the manufacture of NAND memories is complex and costly.

In NOR memories, instead, the memory cells belonging to a same column are connected in parallel between a same bit line and ground. In addition, the memory cells belonging to a same memory word have their gate terminals connected together via word lines and can be selected simultaneously for reading or for programming. Row and column decoder circuits allow a memory word to be addressed by selecting a word line and a plurality of bit lines.

As compared to NAND memories, NOR memories have the advantage of having very short access times (thus they are faster during reading), moreover, they can be manufactured using a simpler and less costly fabrication process. However, NOR memories are disadvantageous in that they allow only one memory word to be programmed at a time. Thus, it is not possible to perform string programming, and it is necessary to repeat the programming step entirely for each word to be stored in memory. Consequently, NOR memories are slow during programming and are not suited for use in fields in which fast acquisition of a high amount of data is required (as in the case, for instance, of digital cameras).

SUMMARY OF THE INVENTION

According to the present invention, a string programmable memory with NOR architecture is provided.

A memory having a NOR architecture has a memory array including a plurality of memory cells arranged in rows and columns in NOR configuration, the memory cells arranged on a same row being connected to one of a plurality of word lines; and the memory cells arranged on a same column being connected to one of a plurality of bit lines, and a column decoder.

The column decoder comprises a plurality of selection stages, each of which is connected to respective bit lines and receives first bit line addressing signals. The selection stages comprise word programming selectors controlled by the first bit line addressing signals and supplying a programming voltage to only one of the bit lines of each selection stage. Each selection stage moreover comprises a string programming selection circuit controlled by second bit line addressing signals, thereby simultaneously supplying the programming voltage to a plurality of the bit lines of each selection stage.

The string programming selection circuit comprises a plurality of bit registers that are loaded, during successive clock cycles, with a plurality of data bits, which are then written, simultaneously, to a plurality of bit lines as previously described. Inasmuch as the loading time of a bit register is significantly faster than the programming time of a memory cell, the time saved by programming a string of words simultaneously far exceeds the time spent loading the registers in preparation for the string programming cycle.

BRIEF DESCRIPTION OF THE DRAWINGS

For a better understanding of the invention, some embodiments thereof are now described, simply to provide non-limiting examples, with reference to the attached drawings, wherein.

DETAILED DESCRIPTION OF THE INVENTION

Figure 1:
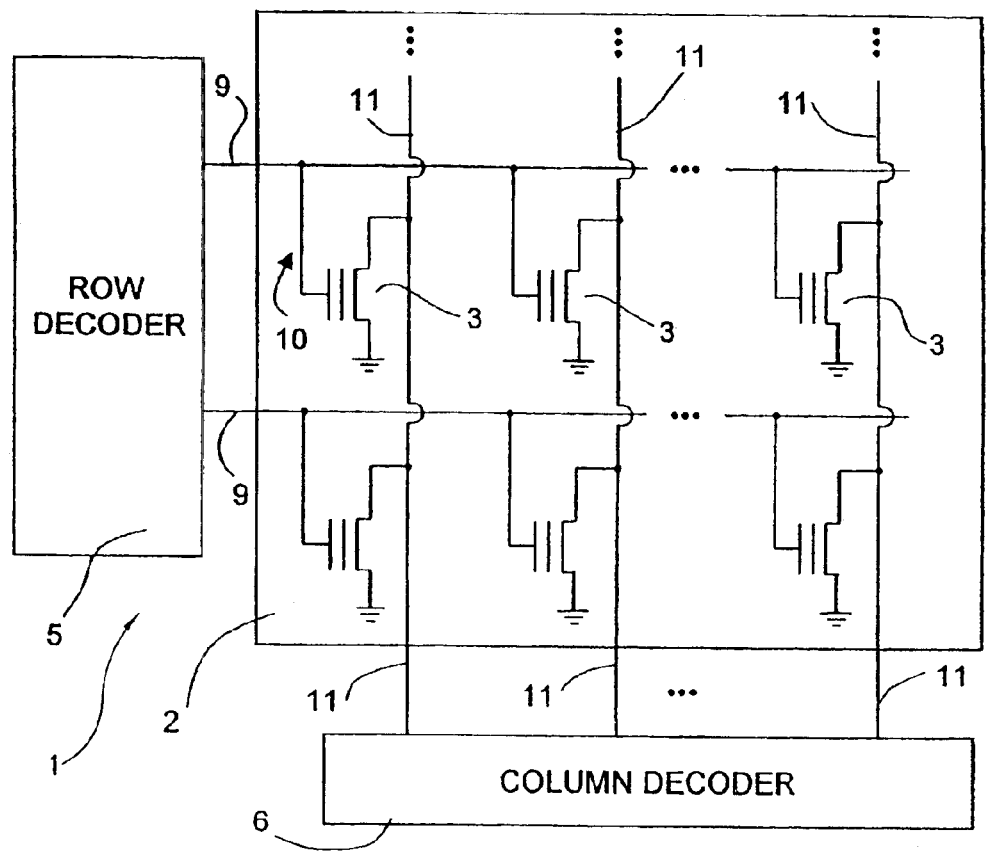
FIG. 1 shows a NOR memory of known type.

FIG. 1 illustrates a two level nonvolatile memory having NOR architecture, in particular with 128 columns per bit. The memory 1 comprises a memory array 2, formed by a plurality of memory cells 3 arranged in rows and columns, a row decoder 5, of known type, and a column decoder 6 having a structure described in detail with reference to the following figures. The gate terminals of the memory cells 3 belonging to a same row are connected together via word lines 9 connected to the row decoder 5. In addition, the memory cells 3 belonging to a same column have their drain terminals connected each to a respective bit line 11.

Figure 2:
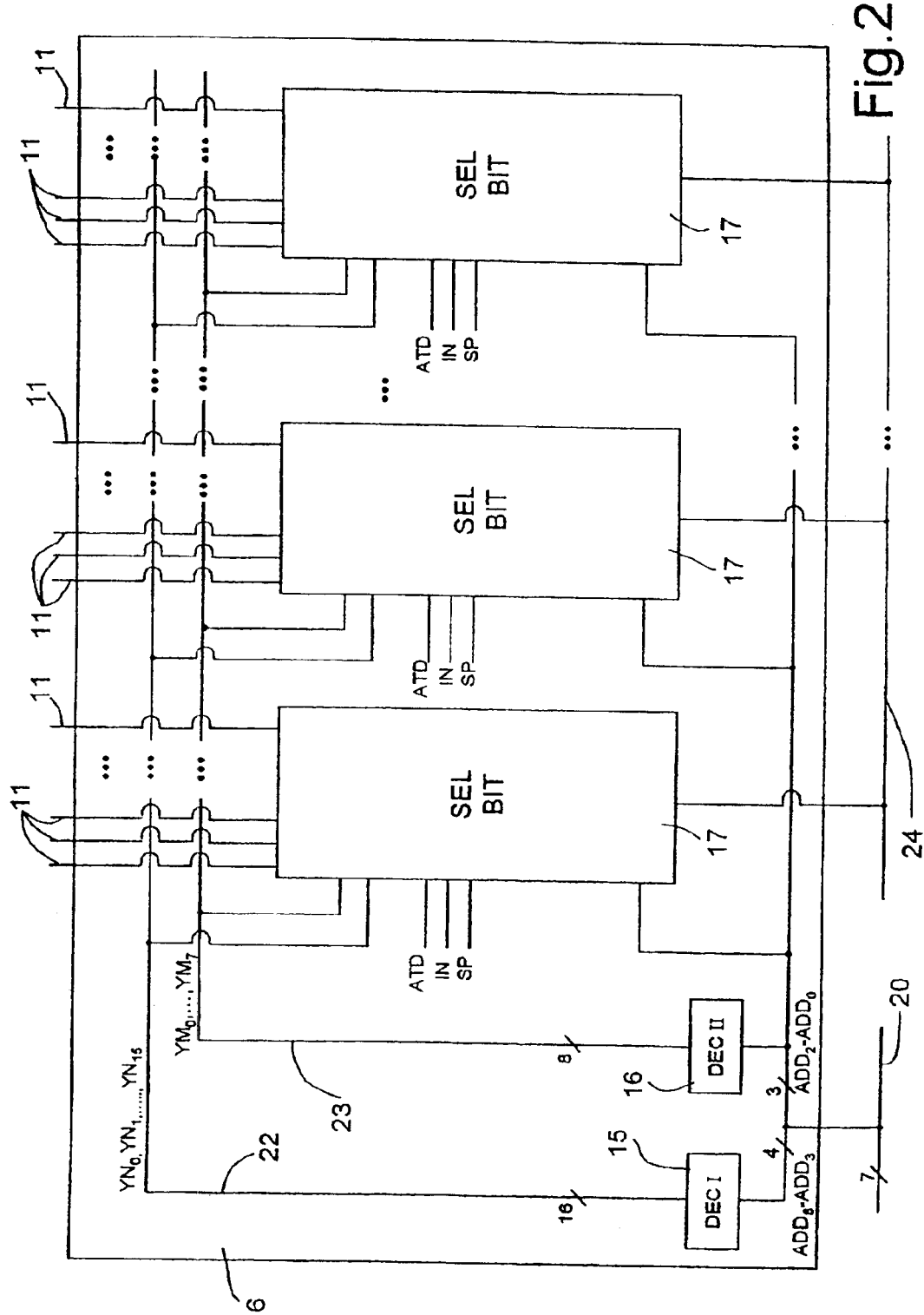
FIG. 2 illustrates a simplified block diagram of a column decoder belonging to the memory of FIG. 1, implementing a first embodiment of the present invention.

With reference to FIG. 2, the column decoder 6 comprises a first level decoder stage 15, a second level decoder stage 16, and a plurality of bit selection stages 17. In particular, the bit selection stages 17 are equal in number to the bits forming a memory word (normally eight or sixteen). The example discussed below has an eight word memory configuration.

The first level decoder stage 15 has inputs connected to an address bus 20 supplying a group of four first level address bits $ADD_6$, $ADD_3$ and an output connected to a first level bus 22 and supplying sixteen first level signals $YN_0, \ldots, YN_{15}$, each having a high logic value and a low logic value.

The second level decoder stage 16 has inputs connected to the address bus 20 supplying a group of three second level address bits $ADD_2$-$ADD_0$ and outputs connected to a second level bus 23 and supplying eight second level signals $YM_0 \ldots, YM_7$, defining first bit line addressing signals.

Each of the bit selection stages 17 has a group of first level inputs, connected to the first level bus 22, and a group of second level inputs, connected to the second level bus 23. The bit selection stages 17 are also directly connected to the address bus 20 supplying second level address bits $ADD_2$-$ADD_0$. The bit selection stages 17 are connected to the outside of the memory 1, to receive a string-programming signal SP, and to circuits inside the memory (known and not illustrated) supplying initialization pulses IN and synchronization pulses ATD.

In addition, the bit selection stages 17 are each connected to respective groups of bit lines 11 of the memory array 2 and to a respective data bus line 24. Each group of bit lines 11 comprises, for example, 128 bit lines 11.

Figure 3:
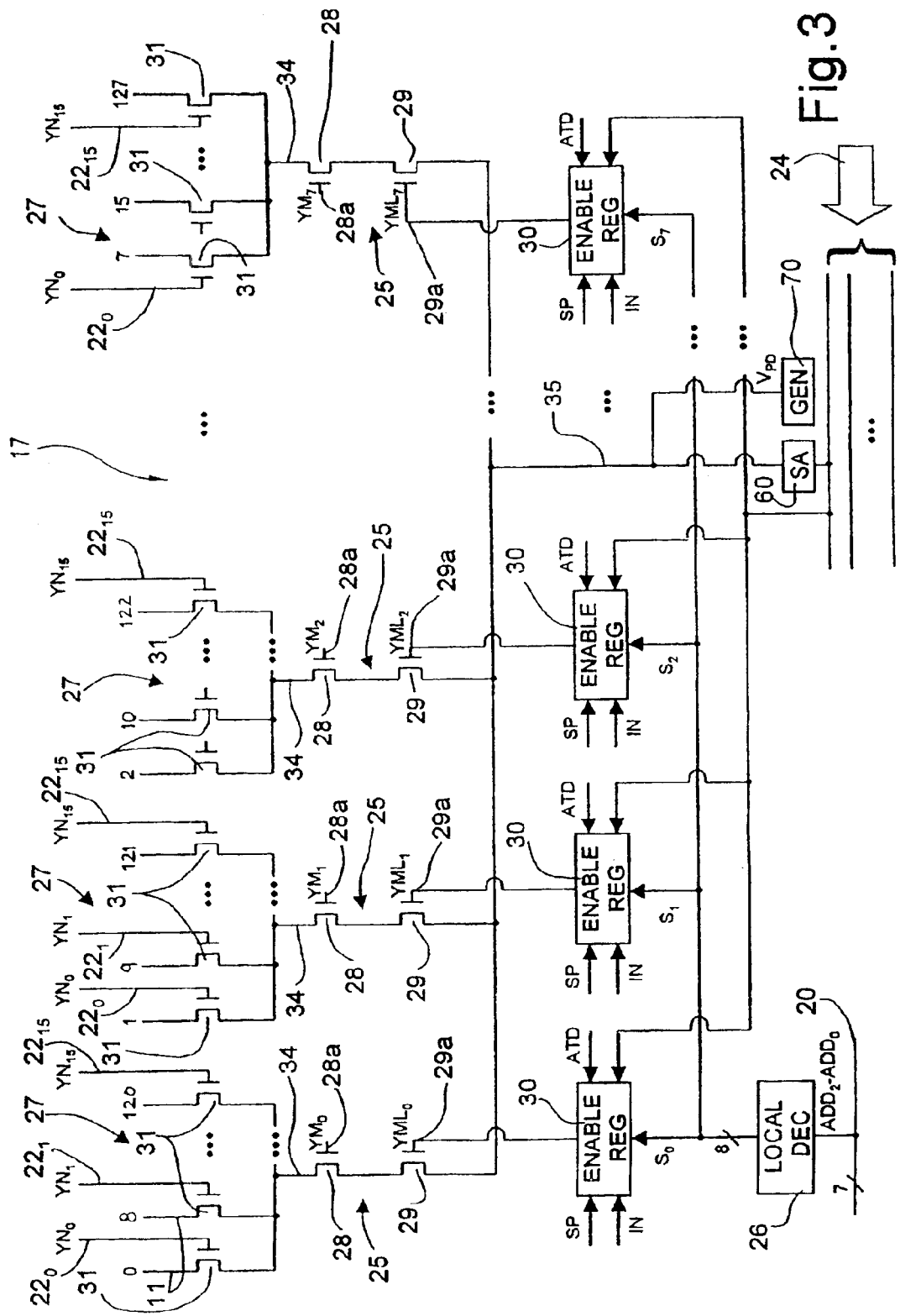
FIG. 3 illustrates a simplified circuit diagram of a block of the column decoder of FIG. 2.

FIG. 3 shows a simplified circuit diagram of a bit selection stage 17, comprising a plurality of selection branches 25 and a local decoder 26 defining string decoder means. In particular, the selection branches 25 are equal in number to the second level signals $YM_0, \ldots, YM_7$ (eight, in the case illustrated).

The local decoder 26 is connected to the address bus 20, so as to receive at the input the second level address bits $ADD_2$-$ADD_0$, and has eight outputs, each of which is connected to a respective selection branch 25 and supplies a local addressing signal $S_0, \ldots, S_7$ defining a second bit line addressing signal. In addition, the local decoder 26 (not illustrated in detail) comprises a combinatory circuit, obvious for the person skilled in the art, for selectively setting one of the local addressing signals $S_0, \ldots, S_7$ at the low logic level, according to the second level address bits $ADD_2$-$ADD_0$.

Each of the selection branches 25 comprises a first level selector stage 27, a second level selector stage 28 (defining word programming selection means), a string selector 29, and a local enable register 30 (together defining string programming selection means).

Each first level selector stage 27 comprises a plurality of first level selectors 31 (sixteen, in the case illustrated), preferably formed by NMOS transistors having drain terminals connected to respective bit lines 11 and source terminals connected to a respective first connection line 34. In each first level selector stage 27, moreover, each first level selector 31 has its gate terminal connected to a respective line $22_0, 22_1, \ldots, 22_{15}$ of the first level bus 22 (not shown), to receive one of the first level signals $YN_0, \ldots, YN_{15}$, defining a third bit line addressing signal.

In each selection branch 25, the second level selector 28 and the string selector 29, preferably formed by NMOS transistors, are connected in series between the respective selector stage 27 and a second connection line 35. In addition, each second level selector 28 has its gate terminal 28a connected to a respective line of the second level bus 23 (not shown), so as to receive one of the second level signals $YM_0, \ldots, YM_7$, while each string selector 29 has its gate terminal 29a connected to an output of a respective local enable register 30 (defining enable means).

The second connection line 35 is connected to a column amplifier 60 ("sense amplifier") and to a programming voltage source 70 supplying a programming voltage $V_{PD}$. The output of the column amplifier 60 is connected to a data line $24_J$ of the data bus 24.

Each local enable register 30, described in detail hereinafter, receives the string programming signal SP, the sync pulses ATD and initialization pulses IN, and is connected to a respective output of the local decoder circuit 26, so as to receive one of the local addressing signals $S_0, \ldots, S_7$. In addition, all the local enable registers 30 belonging to a same bit selection stage 17 have further respective inputs connected to the data line $24_J$ of the data bus 24. Each of the local enable circuits 30 supplies on its own output a string enable signal $YML_0, \ldots, YML_7$ to control the respective string selector 29 on and off.

Figure 4:
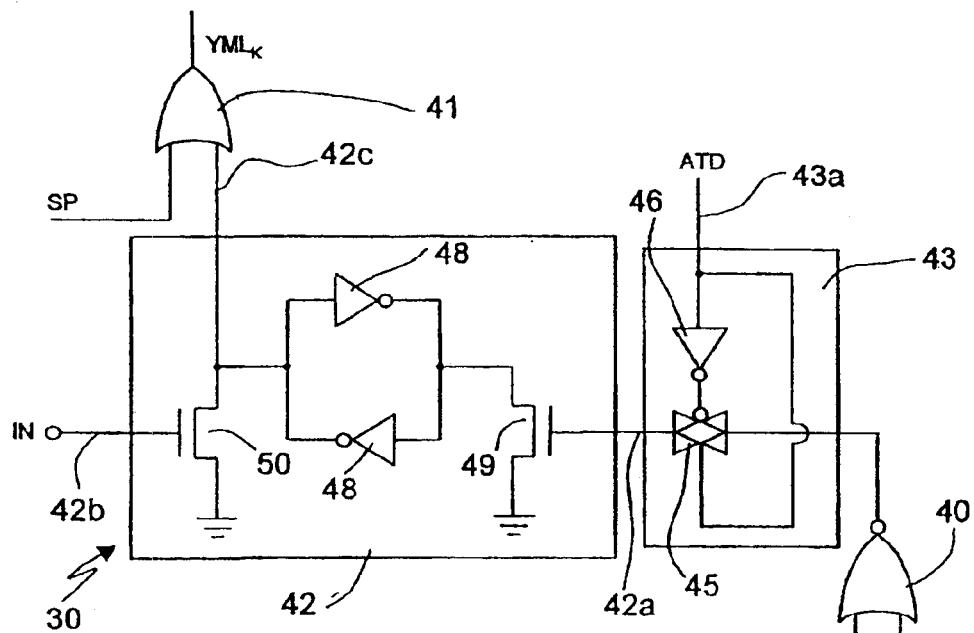
FIG. 4 shows a circuit diagram of a part of the block of FIG. 3 in greater detail.

With reference to FIG. 4, each local enable register 30 comprises a NOR gate 40, an OR gate 41, and a bistable circuit 42 of the set-reset type.

The NOR gate 40 has a first input connected to the data line $24_J$ of the data bus 24 and a second input connected to a respective output of the local decoder circuit 26 supplying one of the local addressing signals $S_0, \ldots, S_7$, here indicated for reasons of simplicity by $S_k$. In addition, an output of the NOR gate 40 is connected to a set terminal 42a of the bistable circuit 42 via a switch 43 which has a control terminal 43a receiving the sync pulses ATD. Conveniently, the switch 43 comprises a CMOS pass gate 45 having a first and a second control terminals both connected to the control terminal 43a, the former directly, and the latter via an inverter 46. Consequently, the switch 43 is normally open and closes only in the presence of a sync pulse ATD.

The bistable circuit 42 preferably comprises a pair of inverters 48, arranged back-to-back and connected between respective drain terminals of a first and a second drive transistors 49, 50, which have grounded source terminals. The gate terminal of the first drive transistor 49 forms the set terminal 42a, while the gate terminal and the drain terminal of the second drive transistor 50 form, respectively, a reset terminal 42b receiving the initialization pulses IN, and an output terminal 42c of the bistable circuit 42. Consequently, the output terminal 42c supplies a selection value (having a high logic value) if a pulse is supplied to the set terminal 42a, and a deselection value (having a low logic value) if a pulse is supplied to the reset terminal 42b.

The OR gate has a first input connected to the output terminal 42c of the bistable circuit 42, a second input receiving the string programming signal SP, and an output connected to the gate terminal 29a of the respective string selector 29 and supplying one of the string enable signals $YML_0, \ldots, YML_7$, here indicated for reasons of convenience by $YML_k$.

The operation of the memory 1 is the following.

Before single word programming or string programming, the memory 1 is erased to bring the memory cells 3 into a non-programmed state, normally associated with the high logic value. A programmed state, instead, is associated to the low logic value. Consequently, after erasing, it is necessary to program only the memory cells 3 in which a low logic value is to be stored.

During single word reading or programming, the string programming signal SP is brought to the non-active value (associated with the high logic value) to force the string enable signals $YML_0, \ldots, YML_7$ to the high logic value (FIG. 4). All the string selectors 29 are thus closed, and the column decoder 6 operates in a traditional way. In particular, the first level decoder 15 sets one of the first level signals $YN_0, \ldots, YN_{15}$ at the high logic level, and all the other first level signals $YN_0, \ldots, YN_{15}$ at the low logic level (FIG. 3). In this way, in each first level selector stage 27, only one first level selector 31 is closed, and the relevant bit line 11 is connected to its respective connection line 34. Likewise, the second level decoder 16 sets one of the second level signals $YM_0, \ldots, YM_7$ at the high logic value so as to cause the relevant second level selector 28 to close, while all the other second level signals $YM_0, \ldots, YM_7$ are kept at the low logic value. Consequently, only one bit line 11 is selected for reading or programming and is connected, via the column amplifier 60, to the data bus 24 or to the programming voltage source 70.

When, instead, string programming is carried out, all the second level signals $YM_0, \ldots, YM_7$ are brought to the high logic value, so as to close all the second level selectors 28. The string programming signal SP is brought to the active value (associated with the low logic value) and alternatively allows the selection or the deselection value present on the output terminals 42c of the respective bistable circuit 42 to be supplied to the gate terminals 29a of the string selectors 29(FIG. 4). Meanwhile, the first level decoder 15 and the first level signals $YN_0, \ldots, YN_{15}$ operate during string programming in the same fashion as during single word programming. Thus, a single first level selector 31 is closed in each of the first level selector stages, according to the address supplied to the decoder 15 on the four first level address bits $ADD_6, ADD_3$.

With reference to FIG. 4, an initialization pulse IN is first supplied to the reset terminals 42b of the bistable circuits 42, so as to bring all the output terminals 42c of the bistable circuits 42 and the string enable signals $YML_0, \ldots, YML_7$ to the deselection value (in practice, all the bistable circuits 42 are brought in a reset state).

Then, in successive clock cycles, a control unit (of known type and not illustrated) supplies the data bus 24 with words having consecutive column addresses and forming a string to be stored in the memory 1. In the described embodiment, one string is formed by eight words, for example, of sixteen bits each.

The words of the string to be stored are sequentially and temporarily loaded in the local enable registers 30 (FIG. 3). At each clock cycle, the local decoder 26 sets in sequence one of the local addressing signals $S_0, \ldots, S_7$ at the low logic value, while all the other signals are kept at the high logic value.

When the local addressing signal $S_k$ is brought to the high logic value, the low logic value is forced on the output of the NOR gate 40 and on the set terminal 42a, regardless of the logic value present on the data line $24_j$ of the data bus 24. Consequently, the bistable circuit 42 does not switch and remains in the state previously set.

When the local addressing signal $S_k$ is set at the low logic value, the output of the NOR gate 40 supplies a complementary logic value with respect to the logic value present on the data bus 24. This complementary logic value is transferred to the set terminal 42a of the bistable circuit 42 upon arrival of a sync pulse ATD, when the switch 43 is closed. Consequently, if the data line $24_j$ of the data bus 24 supplies the high logic level, the low logic level is supplied to the set terminal 42a, and the bistable circuit 42 remains in the initial reset state. If, instead, a low logic level is present on the data line $24_j$ of the data bus 24, the high logic level is supplied to the set terminal 42a, the bistable circuit 42 switches to a set state, and the output terminal 42c is brought to the selection value.

In practice, at the end of loading of the words of the string to be stored, the bistable circuits 42 associated to memory cells 3 to be programmed at the low logic value are in the set state, and all the others are in the reset state.

Since, as has been mentioned previously, the string programming signal has the active value (low logic value), the values present on the output terminals 42c of the bistable circuits 42 are transferred onto the outputs of the respective OR gates 41.

Consequently, the string enable signals $YML_0, \ldots, YML_7$ associated with bistable circuits 42 in the set state are at the high logic value, and their respective string selectors 29 are closed. The string enable signals $YML_0, \ldots, YML_7$ associated with bistable circuits 42 in the reset state are at the low logic value, and their respective string selectors 29 are open.

In this way (FIG. 3), only the bit lines 11 connected to memory cells 3 that are to be programmed within the word string to be stored are selected.

The selected memory cells 3 may be then written and verified as usually, until the desired programming level is reached.

The time for programming a plurality of words forming a string is therefore equal to the time required for programming the slowest memory cell 3 among the selected ones, and is therefore considerably shorter than in known memories, where the time for programming a plurality of words is proportional to the number of the words.

FIGS. 5–8, wherein the parts in common with FIGS. 1–4 are designated by the same reference numbers, illustrate a second embodiment of the present invention, which, in particular, may be used for multilevel nonvolatile memories. For convenience, hereinafter reference will be made to a four-level memory, without thereby limiting thereto.

Figure 5:
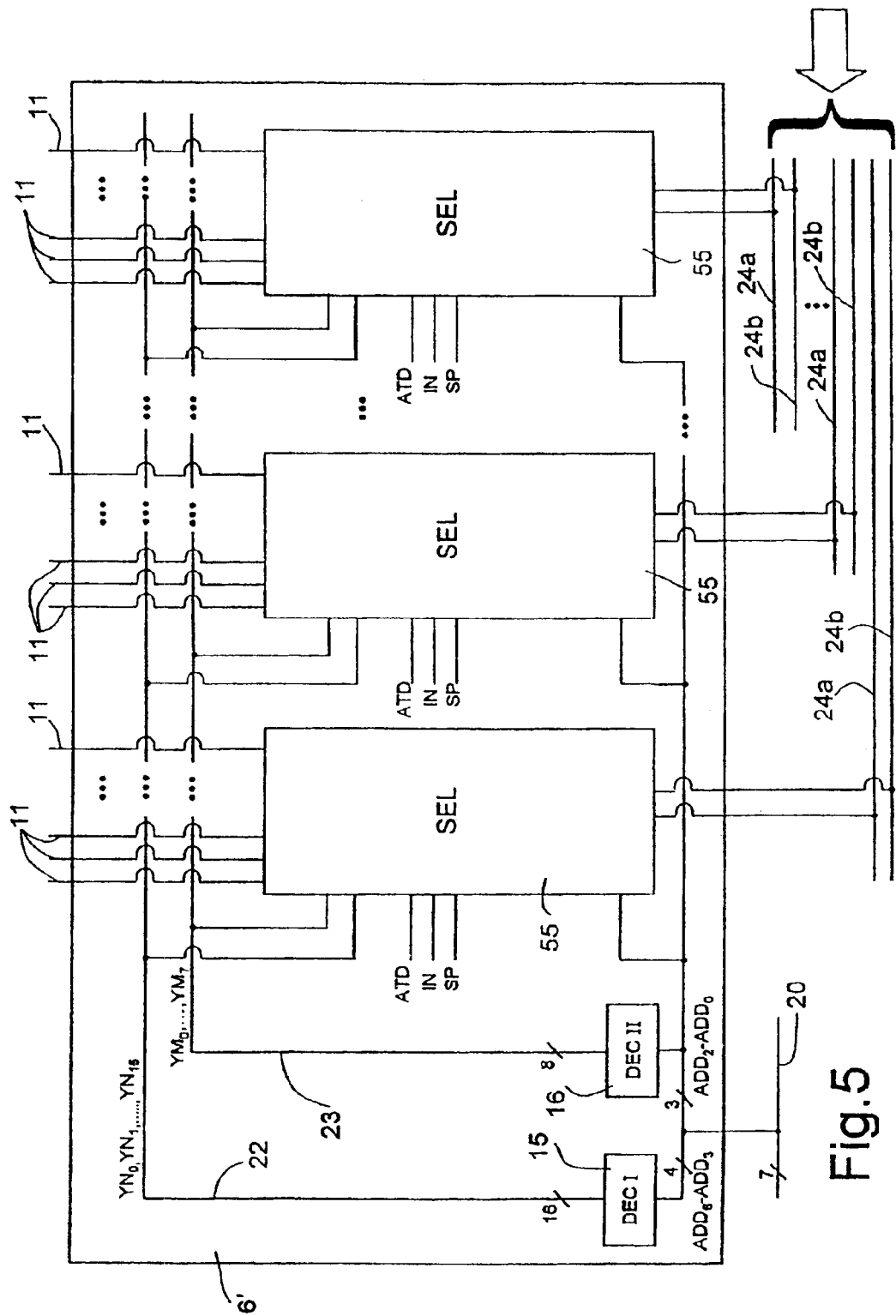
FIG. 5 illustrates a simplified block diagram of a column decoder belonging to the memory of FIG. 1, implementing a second embodiment of the present invention.

FIG. 5 shows a column decoder 106 differing from the column decoder 6 of FIG. 2 in that the bit selection stages 17 are replaced by column selection stages 55. In particular, as for the bit selection stages 17 of FIG. 2, the column selection stages 55 are connected to the first level and second level decoders 15, 16, namely, to the first level decoders 15 through the first level bus 22, supplying the first level signals $YN_0, \ldots, YN_{15}$, and to the second level decoders 16 through the second level bus 23, supplying the second level signals $YM_0, \ldots, YM_7$. Each column selection stage 55 is moreover connected to a plurality of bit lines 11 (for example, 128 lines), to the address bus 20, and to a respective pair of data lines 24a, 24b of the data bus 24, and receives the string programming signal SP, the sync pulses ATD, and the initialization pulses IN.

Figure 6:
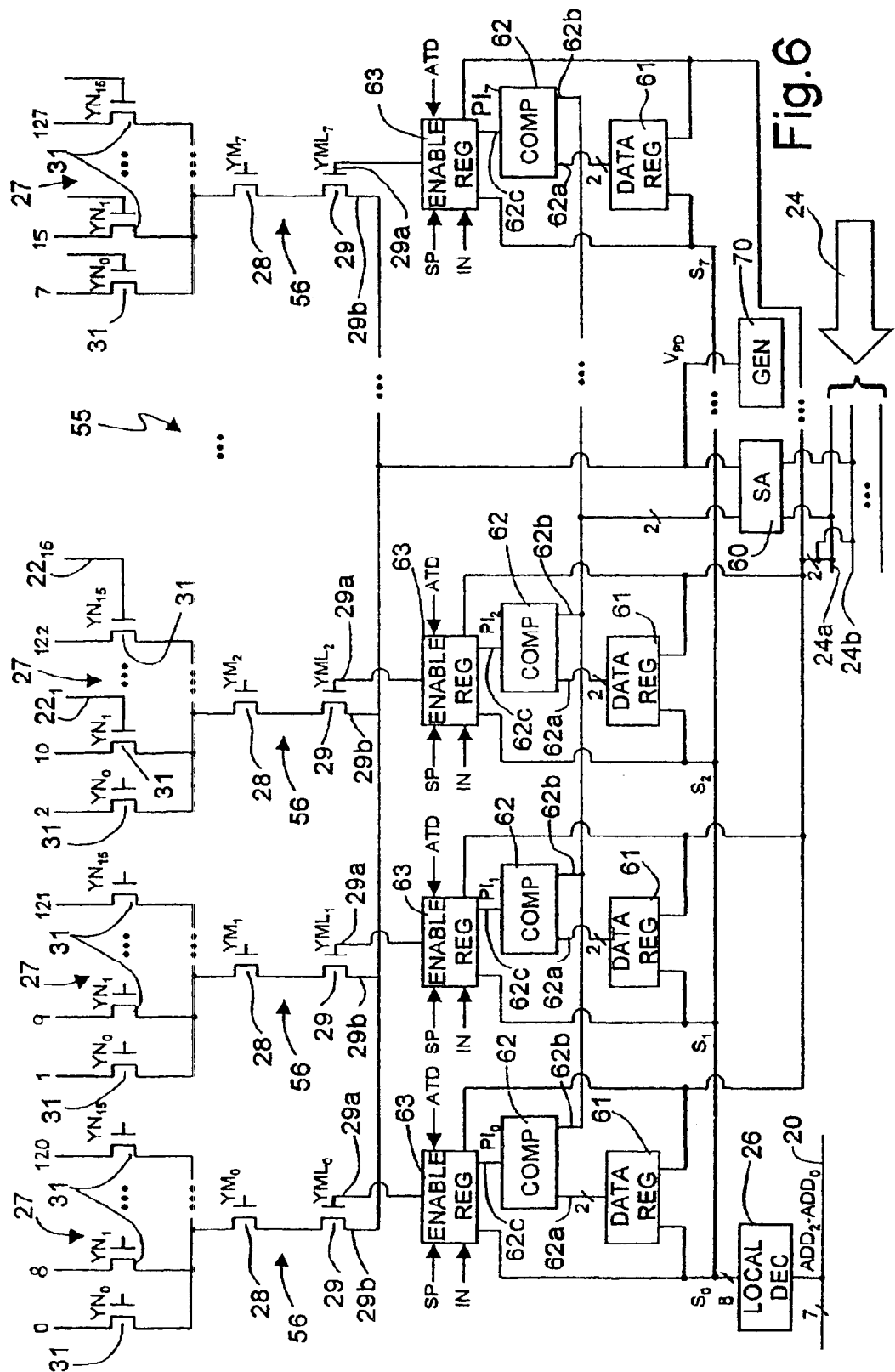
FIG. 6 illustrates a simplified circuit diagram of a block of the column decoder of FIG. 5.

With reference to FIG. 6, a column selection stage 55 comprises a plurality of selection branches 56 (eight, in the case in point) and the local decoder 26.

As in FIG. 3, the local decoder 26 is connected to the address bus 20, so as to receive the second level address bits $ADD_2$-$ADD_0$, and has eight outputs, each connected to a respective selection branch 56 and supplying a respective local addressing signal $S_0, \ldots, S_7$.

Each selection branch 56 comprises a first level selector stage 27, formed by a plurality of first level selectors 31, a second level selector 28, and a string selector 29. The source terminals 29b of the string selector 29 are connected together and to the data bus 24, through the column amplifier 60, as well as to the programming voltage source 70. In addition, each of the selection branches 56 comprises a data register 61, a comparator 62, and a local enable register 63, which, all together, define enable means.

The data registers 61 are each connected to a respective output of the local decoder 26, and receive a respective local addressing signal $S_0, \ldots, S_7$, and to the respective pair of data lines 24a, 24b of the data bus 24. In addition, each data register 61 has two outputs connected to first inputs 62a of a respective comparator 62, which has two second inputs 62b connected to the column amplifier 60. Furthermore, each of the comparators 62 has an output 62c connected to a respective local enable register 63 and issuing a respective programming interrupt signal $PI_0, \ldots, PI_7$. Each comparator 62 is formed by a combinatory circuit (for example, formed by XOR gates 67 and one AND gate 68—FIG. 8) thereby allowing each first input 62a to be compared with a respective second input 62b of the comparator 62. When the logic values present on the first and second inputs 62a, 62b of the comparator 62 are equal two by two, the respective programming interrupt signal $PI_0, \ldots, PI_7$ is set at a high logic value; otherwise, it is set at a low logic value.

The local enable registers 63 are connected to a respective output of the local decoder 26, supplying each local enable register 63 with a local addressing signal $S_0, \ldots, S_7$, and to the data lines 24a, 24b of the data bus 24. In addition, the local enable registers 63 receive the string programming signal SP, the sync pulses ATD, and the initialization pulses IN, and have outputs connected to respective gate terminals 29a of the string selectors 29.

Figure 7:
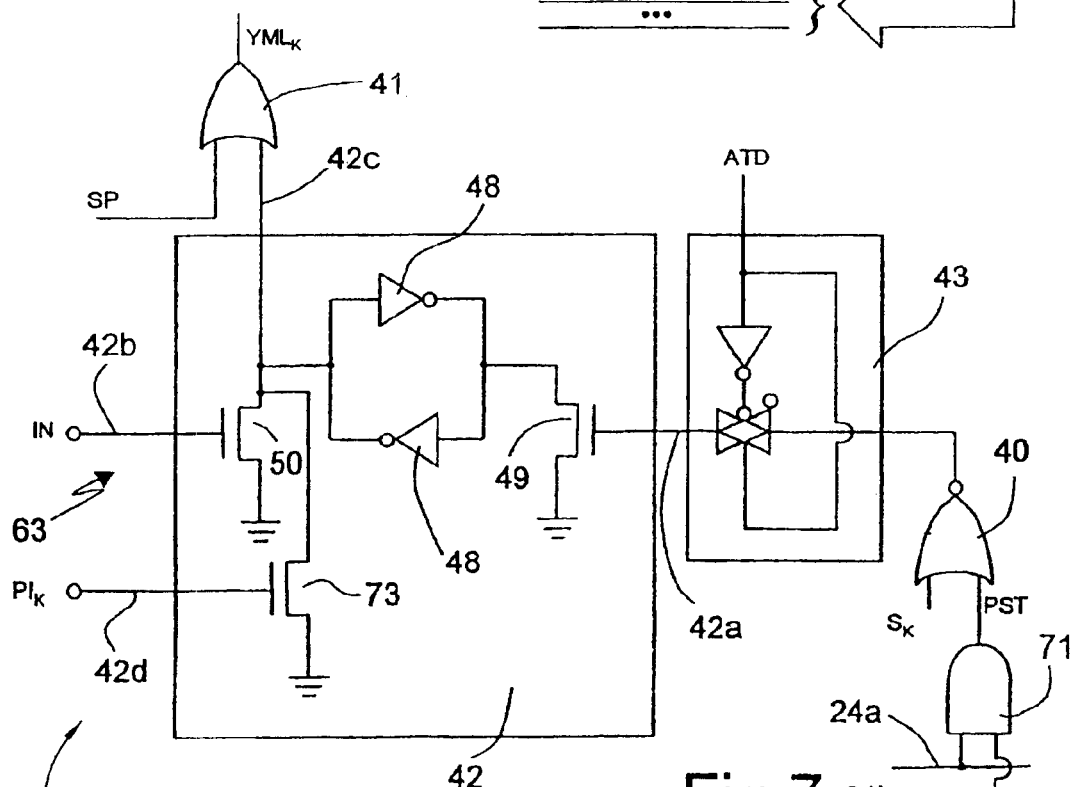

With reference to FIG. 7, a local enable register 63 comprises the same elements as the local enable register 30 of FIG. 4. The local enable register 63 moreover comprises an AND gate 71 having inputs connected to the pair of data lines 24a, 24b of the data bus 24, and an output connected to the first input of the NOR gate 40. Furthermore, in the local enable register 63 the bistable circuit 42 has a first reset input 42b and a second reset input 42d. In particular, the first reset terminal 42b receives the initialization pulses IN, and the second reset terminal 42d is connected to the output 62c of a respective comparator 62 and receives a respective programming interrupt signal, here indicated $PI_k$. The second reset terminal 42d is connected to a gate terminal of a third drive transistor 73, of NMOS type, which has grounded source terminal and drain terminal connected to the output 42c of the bistable circuit 42. In practice, the second and third drive transistors 50, 73 define an inverted logical sum gate.

Figure 8:
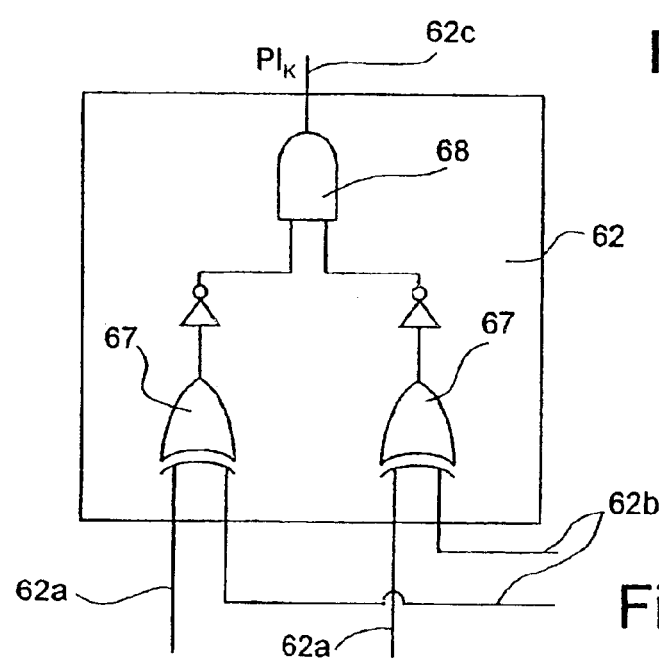
FIGS. 7 and 8 illustrate circuit diagrams of parts of the block of FIG. 6.

The operation of the column selection stage 55 will now be described with reference to FIGS. 6–8.

When string programming is performed, one of the first level signals $YN_0, \ldots, YN_{15}$ is set to a high logic level, so as to select, in each first level selector stage 27, a respective bit line 11. In addition, the second-level signals $YM_0, \ldots, YM_7$ are set at a high logic value, the string programming signal SP is brought to the active value (high logic value), and an initialization pulse IN is supplied, so as to bring all the bistable circuits 42 in the reset state, as evident from FIG. 7.

Figure 9:
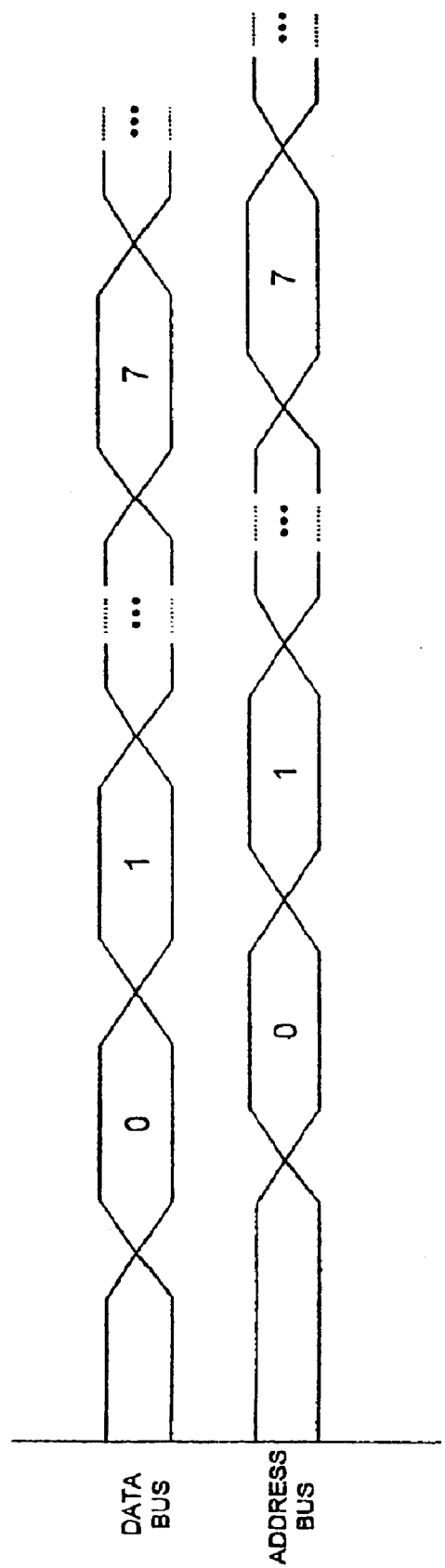
FIG. 9 shows patterns of signals for the column decoder circuit of FIG. 5.

Then, in successive clock cycles, words forming a string to be stored are loaded in the data register 61. FIG. 9 illustrates the patterns of the signals present on the data bus 24 and on the address bus 20 during loading of an eight-word string. In particular, two bits are loaded in each data register 61 (each memory cell may store four possible programming levels).

At the same time, the bistable circuits 42 are brought in the set state if connected to a memory cell 3 to be written; otherwise, they are kept in the reset state. In fact, for four-level memory cells the non-programmed state normally corresponds to the value "11" (two bits at the high logic value). Consequently, when the memory cell 3 is to remain in the non-programmed state, both the data lines 24a, 24b of the data bus 24 are at a high logic value. The output of the AND gate 71 is at a high logic value, and, when the local addressing signal $S_k$ is set at the low logic value and a sync pulse ATD is supplied, the low logic value is supplied to the set terminal 42a of the bistable circuit 42. Consequently, the bistable circuit 42 is kept in the reset state, and the string enable signal $YML_0, \ldots, YML_7$ is at the low logic value and determines opening of the respective string selector 29 (FIG. 6). The corresponding bit line 11 and the memory cell 3 connected thereto are thus deselected.

The memory cell 3 must instead be written when the value to be stored is other than "11," i.e., when at least one of the data lines 24a, 24b of the data bus 24 is at the low logic value. In this case (FIG. 7), a high logic value is transferred to the set terminal 42a through the AND gate 71 and the NOR gate 40, and the bistable circuit 42 switches to the set state and closes the respective string selector 29 (FIG. 6).

In this way, the memory cells 3 to be written are selected.

Next, a first writing step, to reach a first programming level of the selected memory cells 3 (corresponding to the value "10"), and a verify step, in which the selected memory cells 3 are read sequentially, are carried out. During verify, the column amplifier 60 supplies, to the second inputs 62b of the comparators 62, pairs of logic values corresponding to the values stored in the memory cells 3.

The comparators 62 compare the values stored in the data registers 61 with the values stored in the memory cells 3. These values are equal for the memory cells 3 that have reached the desired programming level. In this case, the corresponding programming interrupt signals $PI_0, \ldots, PI_7$ are set at the high logic value, so as to bring the respective bistable circuits 42 into the reset state and cause the respective string selectors 29 to open. The memory cells 3 that have reached the desired programming level are thus deselected, and the others remain selected.

The process is then repeated until programming of the memory cells 3 associated with the string to be stored is completed.

The advantages of the present invention emerge clearly from the foregoing description.

The described memory 1, in fact, can be string programmed even if it has NOR architecture, and may be programmed considerably faster than known NOR memories. Consequently, the memory 1 has a reduced access time, low manufacture costs, and high programming speed, and can thus be advantageously used in a wide range of applications.

Finally, it is clear that numerous modifications and variations can be made to the described memory, all falling within the scope of the invention, as specified in the attached claims.

In particular, the number of bit selection stages or column selection stages may be varied so as to obtain words of different length. In addition, the column decoder may comprise a different number of selection branches, so enabling programming of strings of different length.

In addition, instead of using a local decoder 26 for each bit selection stage 17 or for each column selection stage 55, it is possible to use a single global string decoder arranged like the first and second level decoder stages 15, 16 and connected, via a respective bus, to the bit selection stage 17 or the column selection stage 55, even though this entails a bigger consumption of area of the buses present inside the memory 1.

What is claimed is:

1. A memory device comprising:

a plurality of memory cells arranged in rows and columns in NOR configuration, each one of the plurality of memory cells configured to accept a data bit at a programming input in the presence of an enable voltage at a program enable input, and configured to store the bit of data as one of a plurality of logic levels;

a string programming selection circuit, configured to receive, in the presence of a read enable signal at a first enable input during one clock cycle, a first bit of data at a data input and hold the first bit of data as one of a plurality of logic levels, to receive, in the presence of a read enable signal at the first enable input during a succeeding clock cycle, a second bit of data at the data input and hold the second bit of data, as one of a plurality of logic levels, and further configured, in the presence of a write enable signal at a second enable input, to present the first and second bits of data at first and second outputs;

a connection circuit configured to couple the first and second outputs to the programming inputs of first and second ones of the plurality of memory cells;

a data source for supplying a stream of data bits to the input of the string programming selection circuit; and a circuit configured to provide the write enable signal at the second enable input of the string programming selection circuit and simultaneously providing the enable voltage at the program enable input of each of the plurality of memory cells.

2. The memory device of claim 1 wherein:

the string programming selection circuit is one of a plurality of string programming selection circuits;

the plurality of string programming selection circuits are configured each to receive, at their respective data inputs, a respective one of a plurality of bits of a first data word during a first clock cycle, to receive, at their respective data inputs, a respective one of a plurality of bits of a second data word during the succeeding clock cycle, and to present, at their respective first and second outputs, the received bits of the first and second words; and the connection circuit is configured to couple the first and second outputs of each of the plurality of selection circuits to the programming inputs of corresponding ones of the plurality of memory cells.

3. The memory device according to claim 1 wherein the connection circuit is addressable and may be configured to couple the first and second outputs of the string programming selection circuit to the programming inputs of the first and second ones of the plurality of memory cells or to the programming inputs of third and fourth ones of the plurality of memory cells.

4. A device for programming a memory array, comprising:

a plurality of string programming selection circuits, each configured to receive, at respective data inputs, a respective bit of a first data word during a first clock cycle, to receive, at their respective data inputs, a respective bit of a second data word during a second clock cycle, and to simultaneously present, at respective first and second outputs, the received bits of the first and second word; and a circuit configured to couple the first and second outputs of each of the plurality of string programming selection circuits with a respective memory cell of the memory array.

5. The device of claim 4 wherein each of the plurality of string programming selection circuits is configured to receive respective bits of additional words during succeeding clock cycles, and to present the bits at respective additional outputs, simultaneously with the presentation of the bits of the first and second words.

6. The device of claim 4, further comprising a circuit configured to couple the first and second outputs of each of the plurality of string programming selection circuits to a write enable terminal of a corresponding memory cell of the memory array, such that a first logic level at any of the outputs serves to write enable the corresponding memory cell.

7. The device of claim 6, further comprising a circuit configured to simultaneously program each write enabled memory cell of the memory array to a level corresponding to the first logic level.

8. A device for programming a memory array, comprising:

means for sequentially receiving a plurality of data words, each comprised of a number of bits;

means for holding each data word while succeeding data words are received; and means for simultaneously placing a value corresponding to a logic level of each of the number of bits of each of the plurality of data words at a write enable terminal of a corresponding memory cell.

* * * * *